(12) United States Patent
Liu et al.

(10) Patent No.: US 12,381,545 B2
(45) Date of Patent: Aug. 5, 2025

(54) SIGNAL DELAY DEVICE WITH REDUCED SIZE

(71) Applicant: Telefonaktiebolaget LM Ericsson (publ), Stockholm (SE)

(72) Inventors: Yongbin Liu, Chengdu (CN); Yasong Zhang, Beijing (CN); Anatoli Deleniv, Mölndal (SE); Sven Patrik Lindell, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 18/554,742

(22) PCT Filed: Apr. 12, 2021

(86) PCT No.: PCT/CN2021/086596
§ 371 (c)(1),
(2) Date: Oct. 10, 2023

(87) PCT Pub. No.: WO2022/217427
PCT Pub. Date: Oct. 20, 2022

(65) Prior Publication Data
US 2024/0128962 A1    Apr. 18, 2024

(51) Int. Cl.
*H03K 5/159*    (2006.01)
*H03F 3/20*    (2006.01)
*H03K 5/00*    (2006.01)

(52) U.S. Cl.
CPC ............. *H03K 5/159* (2013.01); *H03F 3/20* (2013.01); *H03K 2005/00078* (2013.01)

(58) Field of Classification Search
CPC . H03K 5/159; H03K 2005/00078; H03F 3/20
See application file for complete search history.

(56) References Cited

U.S. PATENT DOCUMENTS 5,146,191 A * 9/1992 Mandai ............... H03H 7/34
                                              333/140
5,187,455 A * 2/1993 Mandai ............... H01P 9/006
                                              333/156
(Continued)

FOREIGN PATENT DOCUMENTS

CN      102394335 A  *  3/2012
JP      2014-131252 A    7/2014

OTHER PUBLICATIONS

International Search Report and Written Opinion issued in International Application No. PCT/CN2021/086596 Jan. 19, 2022 (9 pages).

(Continued)

*Primary Examiner* — Ryan Jager
(74) *Attorney, Agent, or Firm* — Rothwell, Figg, Ernst & Manbeck, P.C.

(57) ABSTRACT

The present disclosure provides a device for signal delay. The device comprises: a frame of insulation material; multiple signal electrodes provided in the frame and electrically connected to each other in series; an input terminal electrically connected to a first of the multiple signal electrodes and configured to receive an input signal; and an output terminal electrically connected to a second of the multiple signal electrodes and configured to output an output signal that is delayed by the multiple signal electrodes with respect to the input signal, wherein at least one of the multiple signal electrodes is located at a different height than those of other signal electrodes with respect to a surface on which the device is to be mounted.

15 Claims, 12 Drawing Sheets

(56) References Cited

U.S. PATENT DOCUMENTS

| | | | | |
|---|---|---|---|---|
| 5,365,203 A * | 11/1994 | Nakamura | ............... | H01P 9/006 333/161 |
| 5,499,005 A * | 3/1996 | Gu | ............... | H01P 5/12 336/200 |
| 5,815,050 A * | 9/1998 | Brooks | ............... | H03H 7/34 333/156 |
| 5,990,760 A * | 11/1999 | Yoshida | ............... | H01P 9/006 333/161 |
| 6,337,609 B1 * | 1/2002 | Endou | ............... | H01P 3/06 333/156 |
| 6,556,102 B1 * | 4/2003 | Sengupta | ............... | H01P 1/181 333/156 |
| 7,579,929 B2 * | 8/2009 | Hikino | ............... | H01P 1/15 333/128 |
| 8,159,313 B2 * | 4/2012 | Uchaykin | ............... | H05K 1/165 333/185 |
| 8,378,223 B1 * | 2/2013 | Shiue | ............... | H05K 1/0248 174/250 |
| 10,454,444 B2 * | 10/2019 | Hahn | ............... | H01L 25/16 |
| 2006/0114079 A1 * | 6/2006 | Cantrell | ............... | H01P 9/00 333/160 |
| 2013/0037315 A1 * | 2/2013 | Shiue | ............... | H05K 1/0245 174/262 |
| 2018/0262177 A1 * | 9/2018 | Hahn | ............... | H01L 23/66 |
| 2024/0128962 A1 * | 4/2024 | Liu | ............... | H01P 9/00 |

OTHER PUBLICATIONS

Cantrell, W. H. et al., "A Novel Surface-Mount RF Delay Filter for Feedforward LPAs", IEEE, 2005 (4 pages).

* cited by examiner (a) Block diagram (b) Input pulse (c) Delayed output pulse

SIGNAL DELAY DEVICE WITH REDUCED SIZE

CROSS REFERENCE TO RELATED APPLICATIONS

This application is a 35 U.S.C. § 371 National Stage of International Patent Application No. PCT/CN2021/086596, filed 2021 Apr. 12.

TECHNICAL FIELD

The present disclosure is related to the field of electronic device, and in particular, to a signal delay device with a reduced size.

BACKGROUND

This section introduces aspects that may facilitate better understanding of the disclosure. Accordingly, the statements of this section are to be read in this light and are not to be understood as admissions about what is in the prior art or what is not in the prior art.

A delay line, to be more specific, an analog delay line, is a network of electrical components connected in cascade, where each individual element creates a time difference between its input and output. It operates on signals whose amplitude may vary over time. In the case of a periodic signal, the time difference can be described in terms of a change in the phase of the signal. One example of an analog delay line is a bucket-brigade device.

FIG. 1 is a diagram illustrating an exemplary signal delay line 100 and its input and output signals. A pulse signal having a pulse width of $t_P$ which is input to the delay line 100 is shown in (a) and (b) of FIG. 1, and a pulse signal which is delayed by $t_d$ and output from the delay line 100 is shown in (a) and (c) of FIG. 1. Ideally, the delayed output pulse signal is just a time-shifted version of the input pulse signal, as indicated by the "Ideal pulse" in (c) of FIG. 1. However, the practical output pulse signal is typically distorted, as indicated by the "Practical pulse" in (c) of FIG. 1, due to many factors, such as, noise, device electrical characteristics, etc.

Other types of delay line include acoustic (usually ultrasonic), magnetostrictive, and surface acoustic wave devices. A series of resistor—capacitor circuits (RC circuits) can be cascaded to form a delay. A long transmission line can also provide a delay element. The delay time of an analog delay line may be only a few nanoseconds or several milliseconds, limited by the practical size of the physical medium used to delay the signal and the propagation speed of impulses in the medium.

Analog delay lines are applied in many types of signal processing circuits. For example, the Phase Alternating Line (PAL) television standard uses an analog delay line to store an entire video scanline. Acoustic and electromechanical delay lines are used to provide a "reverberation" effect in musical instrument amplifiers, or to simulate an echo. High-speed oscilloscopes used an analog delay line to allow observation of waveforms just before some triggering event.

With the growing use of digital signal processing techniques, digital forms of delay are practical and eliminate some of the problems with dissipation and noise in analog systems. Delay lines are widely used in distributed amplifiers, cathode ray oscilloscope pulse coder and decoder, measuring instrument, Radar, TV system and computers.

There are two types of delay lines used in switching circuits: an electronic type and an electromagnetic type. Electromagnetic delay lines may be further classified as distributed parameter or lumped parameter delay lines. The distributed parameter line more closely approaches a transmission line, whereas the lumped parameter line resembles a filter. Delay ranging from a few nanoseconds to hundreds of micro-seconds are obtainable with electromagnetic lines. For longer delays acoustic delay lines and storage device are used. Acoustic delay lines employ acoustic wave propagation and electro-mechanical transducers at the input and output.

In its simplest form, the lumped parameter delay lines consist of a number of inductors and capacitors that are similar in value. The inductors are connected in series and the capacitors are connected through the junctions between the inductors to the ground. Lumped parameter delay lines can be tapped at several points to give a series of delays and this property is useful in many applications. The products are of the order of 0.01 to 100,000 micro-seconds.

A transmission line may be conductive, and it serves to guide energy from one point (input) to another (output). Normally the transmission lines consists of pair of straight conducting wires or coaxial cables. Any linear conductor possesses both inductive and resistance.

Electronics delay line is an electronic circuit used to delay a pulse waveform. Any mono-stable circuit may be used for this purpose. The input pulse is used to trigger the mono-stable circuit. The output is generated by the mono-stable circuit itself. The amplitude and duration $t_P$ of the output pulse is controlled by the mono-stable circuits. Hence, a mono-stable circuit can be used as pulse delay device as well as a pulse reshaping device.

SUMMARY

According to some embodiments of the present disclosure, a device for signal delay is provided. The device comprises: a frame of insulation material; multiple signal electrodes provided in the frame and electrically connected to each other in series; an input terminal electrically connected to a first of the multiple signal electrodes and configured to receive an input signal; and an output terminal electrically connected to a second of the multiple signal electrodes and configured to output an output signal that is delayed by the multiple signal electrodes with respect to the input signal, wherein at least one of the multiple signal electrodes is located at a different height than those of other signal electrodes with respect to a surface on which the device is to be mounted.

In some embodiments, the frame has one or more holes, and each of the holes has an opening on a first outer surface of the frame and another opening on a second outer surface of the frame which is opposed to the first outer surface. In some embodiments, the first signal electrode is located in a first hole, the second signal electrode is located in a second hole, a third signal electrode is located in a third hole, and a fourth signal electrode is located in a fourth hole.

In some embodiments, each of the multiple signal electrodes is a conductive pattern located on the inner surface of a hole. In some embodiments, two signal electrodes are electrically connected to each other via a conductive pattern on the first or second outer surface of the frame. In some embodiments, the first signal electrode is electrically connected to the fourth signal electrode via a first conductive pattern on the second outer surface of the frame. In some embodiments, the fourth signal electrode is electrically connected to the third signal electrode via a second conductive pattern on the first outer surface of the frame. In some embodiments, the third signal electrode is electrically connected to the second signal electrode via a third conductive pattern on the second outer surface of the frame. In some embodiments, other outer surfaces of the frame than the first and second outer surfaces have a conductive layer disposed thereon. In some embodiments, the conductive layer covers the other outer surfaces of the frame completely. In some embodiments, the first and second outer surfaces have a conductive layer disposed thereon which is insulated from the conductive patterns.

In some embodiments, there are one or more grooves on at least one of the outer surfaces of the frame other than the first and second outer surfaces, such that each of the grooves reduces the cross-sectional area between adjacent signal electrodes. In some embodiments, at least one of the grooves has a cross section of a circular segment. In some embodiments, the at least one of the grooves has a cross section of a semi-circle. In some embodiments, the frame has one or more additional holes, and each of the additional holes has an opening on the first outer surface and another opening on the second outer surface, such that each of the additional holes reduces the cross-sectional area between adjacent signal electrodes. In some embodiments, the device further comprises: an impedance matching circuit located on an outer surface of the device and/or in the device and configured to match the impedance of the device with an impedance of a circuit with which the device is to be electrically coupled. In some embodiments, the insulation material is ceramic.

According to a second aspect of the present disclosure, a power amplifier comprising the device of any of the first aspect is provided.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and therefore are not to be considered limiting of its scope, the disclosure will be described with additional specificity and detail through use of the accompanying drawings.

DETAILED DESCRIPTION

Figure 1:
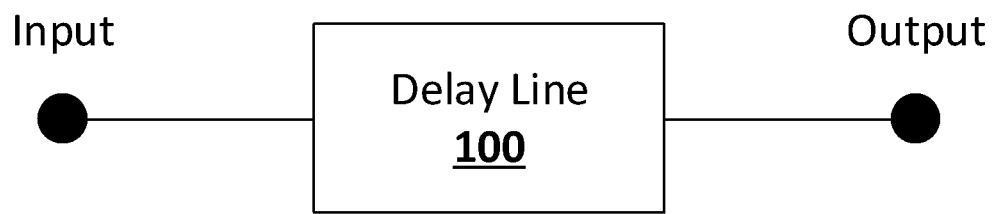
FIG. 1 is a diagram illustrating an exemplary signal delay line and its input and output signals in the related art.
Figure 1:
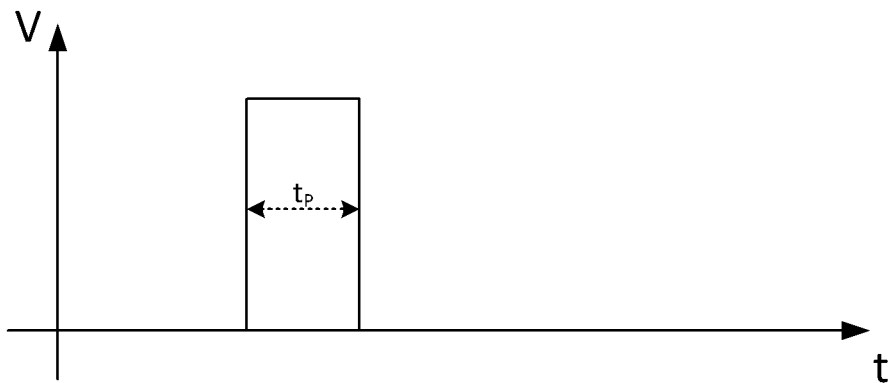
Figure 1:
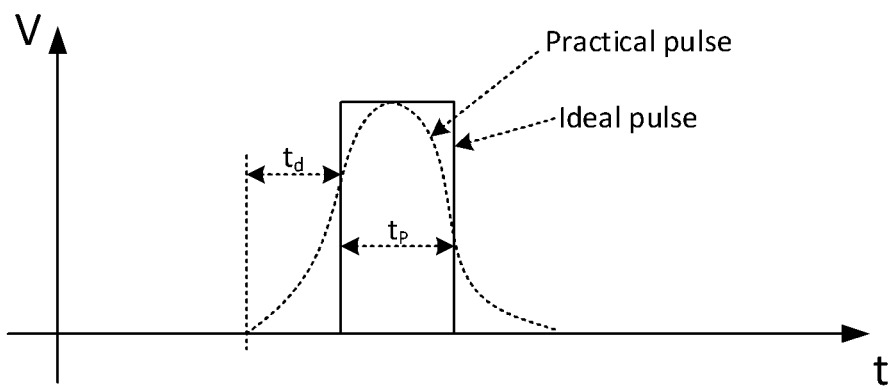

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

Those skilled in the art will appreciate that the term "exemplary" is used herein to mean "illustrative," or "serving as an example," and is not intended to imply that a particular embodiment is preferred over another or that a particular feature is essential. Likewise, the terms "first" and "second," and similar terms, are used simply to distinguish one particular instance of an item or feature from another, and do not indicate a particular order or arrangement, unless the context clearly indicates otherwise. Further, the term "step," as used herein, is meant to be synonymous with "operation" or "action." Any description herein of a sequence of steps does not imply that these operations must be carried out in a particular order, or even that these operations are carried out in any order at all, unless the context or the details of the described operation clearly indicates otherwise.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. It will be also understood that the terms "connect(s)," "connecting", "connected", etc. when used herein, just means that there is an electrical or communicative connection between two elements and they can be connected either directly or indirectly, unless explicitly stated to the contrary.

Conditional language used herein, such as "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below. In addition, language such as the phrase "at least one of X, Y and Z," unless specifically stated otherwise, is to be understood with the context as used in general to convey that an item, term, etc. may be either X, Y, or Z, or a combination thereof.

Of course, the present disclosure may be carried out in other specific ways than those herein set forth without departing from the scope and essential characteristics of the invention. One or more of the specific processes discussed below may be carried out in any communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive.

Although multiple embodiments of the present disclosure will be illustrated in the accompanying Drawings and described in the following Detailed Description, it should be understood that the invention is not limited to the disclosed embodiments, but instead is also capable of numerous rearrangements, modifications, and substitutions without departing from the present disclosure that as will be set forth and defined within the claims.

Further, please note that although the following description of some embodiments of the present disclosure is given in the context of power amplifier, the present disclosure is not limited thereto. In some other embodiments, the signal delay devices described herein may be used in any application which requires signal delay.

Furthermore, relative terms, such as "lower", "bottom", "upper", "top", "left", or "right," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments of the present disclosure are described herein with reference to cross-section illustrations that are schematic illustrations of idealized embodiments (and intermediate structures) of the present disclosure. As such, variations from the shapes of the illustrations as a result, for example, of manufacturing techniques and/or tolerances, may be expected. Thus, the disclosed example embodiments of the present disclosure should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Delay line is an essential part in some feed forward power amplifier (PA) to provide enough delay for the whole circuit, which requires good flatness and delay ripple. Sometimes in order to get long delay and good ripple, the size of a delay line needs to be large, which make it difficult to realize a compact size for PA solution in radio products.

Therefore, some embodiments of the present disclosure is proposed to reduce the coupling between signal electrodes and subsequently to reduce group delay ripple in a ceramic delay line design that is used in a feed forward PA structure. This design may have a better delay ripple and reduced size than that of the existing delay line design.

In the existing delay line designs, in order to achieve required delay and delay ripple in a surface-mount coaxial delay line, the distance between coaxial lines need to be increased, which result in a big size of the delay line and a lower frequency cavity mode. Further, impedance matching is often needed for impedance transformation to 50 Ohm in a delay line design, and therefore extra space on a printed circuit board (PCB) is needed.

In view of the above issues, some embodiments of the present disclosure introduce some new considerations with which a delay line may be designed. The considerations may comprise but not limited to: (1) an arrangement of signal electrodes at different heights to reduce the area occupied by a signal delay device on the PCB; (2) introduction of holes in and/or grooves on a signal delay device to reduce the coupling between signal electrodes and subsequently to reduce group delay ripple; and/or (3) introduction of an impedance matching circuit on a signal delay device. With these considerations, the size and insertion loss of the delay line may be greatly reduced.

Before describing signal delay devices according to some embodiments of the present disclosure, a brief introduction of their fundamental principle will be given first.

Capacitance is the ability of a system to store electric charge. It can be defined by the amount of charge that a body needs in order to raise its electric potential by 1 volt against a grounded reference potential. In a linear system, this is given by:

$$Q = C \cdot V$$

where Q is charge, V is potential difference relative to ground, and C is the capacitance.

Before multiconductor systems are discussed, please remember that by definition, even a single isolated conductor has a capacitance, defined relative to a grounded spherical shell at infinity. For the case of a conducting sphere, this self-capacitance is given by:

$$C = 4\pi\epsilon_0 R$$

where C is the capacitance, $\epsilon_0$ is the permittivity of vacuum, and R is the radius of the conducting sphere.

In typical electrical systems, capacitances between several conductors are of most interest. Mutual capacitance, also referred to as parasitic or stray capacitance, is desired or undesired capacitance (a buildup of charge) that occurs between two charge-holding objects. A mutual capacitance is typically a function of the overlapped area of the two objects which is viewed from their orthogonal or normal direction, the distance between them, and the dielectric of the material that separates them. If a charged object is brought near another object, the charge distribution on the first object will change due to the process of electrostatic induction (not to be confused with electromagnetic induction). Particularly in transmission systems, capacitive coupling between lines is often unintended and troublesome, as it can create noise.

For convenience, it is possible to arrange mutual capacitances of a system of N conductors and one additional ground in matrix form:

$$\begin{bmatrix} C_{m,11} & C_{m,12} & \cdots & C_{m,1N} \\ C_{m,21} & C_{m,22} & \cdots & C_{m,2N} \\ \vdots & \vdots & \ddots & \vdots \\ C_{m,N1} & C_{m,N2} & \cdots & C_{m,NN} \end{bmatrix} \quad (1)$$

The coefficients of this matrix, also called partial capacitances or lumped capacitances, are used in a circuit simulator when a physical system is reduced to a network of discrete elements.

In field theory, another matrix form is more common: the Maxwell capacitance matrix. Because the name is so similar and the coefficients are not identical, it is important to understand the relation between mutual and Maxwell capacitance matrices. The Maxwell capacitance matrix describes a relation between the charge of the $i^{th}$ conductor to the voltages of all conductors in the system.

$$\begin{pmatrix} Q_1 \\ Q_2 \\ \vdots \\ Q_N \end{pmatrix} = \begin{bmatrix} C_{11} & C_{12} & \cdots & C_{1N} \\ C_{21} & C_{22} & \cdots & C_{2N} \\ \vdots & \vdots & \ddots & \vdots \\ C_{N1} & C_{N2} & \cdots & C_{NN} \end{bmatrix} \begin{pmatrix} V_1 \\ V_2 \\ \vdots \\ V_N \end{pmatrix} \quad (2)$$

The Maxwell capacitance matrix coefficient $C_{11}$ could be determined by measuring the charge on conductor 1, when only the potential $V_1=1$ and all other electrodes are grounded. Therefore, the matrix is also often called the ground capacitance matrix. Its inverse, $C^{-1}$, is referred to as the elastance matrix.

The total charge on conductor 1 can be calculated by summing up the contributions from the self- and mutual capacitances as follows (e.g., when N=3).

$$Q_1 = C_{m,11}V_1 + C_{m,12}(V_1 - V_2) + C_{m,13}(V_1 - V_3) = \quad (3)$$

$$(C_{m,11} + C_{m,12} + C_{m,13})V_1 - C_{m,12}V_2 - C_{m,13}V_3$$

For a system with N conductors, the relation between the mutual and Maxwell capacitance matrices is then given by:

$$\begin{pmatrix} Q_1 \\ Q_2 \\ \vdots \\ Q_N \end{pmatrix} = \begin{bmatrix} \sum_{i=1}^{N} C_{m,1i} & -C_{m,12} & \cdots & -C_{m,1N} \\ -C_{m,21} & \sum_{i=1}^{N} C_{m,2i} & \cdots & -C_{m,2N} \\ \vdots & \vdots & \ddots & \vdots \\ -C_{m,N1} & -C_{m,N2} & \cdots & \sum_{i=1}^{N} C_{m,Ni} \end{bmatrix} \begin{pmatrix} V_1 \\ V_2 \\ \vdots \\ V_N \end{pmatrix} \quad (4)$$

One can easily tell a Maxwell capacitance matrix by its negative nondiagonal elements. Further, this Maxwell capacitance matrix is symmetric since the mutual capacitance between the $i^{th}$ conductor and the $j^{th}$ conductor is equal to the mutual capacitance between the $j^{th}$ conductor and the $i^{th}$ conductor, and therefore the equation (4) may be reduced to:

$$\begin{pmatrix} Q_1 \\ Q_2 \\ \vdots \\ Q_N \end{pmatrix} = \begin{bmatrix} \sum_{i=1}^{N} C_{m,1i} & -C_{m,12} & \cdots & -C_{m,1N} \\ -C_{m,12} & \sum_{i=1}^{N} C_{m,2i} & \cdots & -C_{m,2N} \\ \vdots & \vdots & \ddots & \vdots \\ -C_{m,N1} & -C_{m,N2} & \cdots & \sum_{i=1}^{N} C_{m,Ni} \end{bmatrix} \begin{pmatrix} V_1 \\ V_2 \\ \vdots \\ V_N \end{pmatrix} \quad (4')$$

Figure 2:
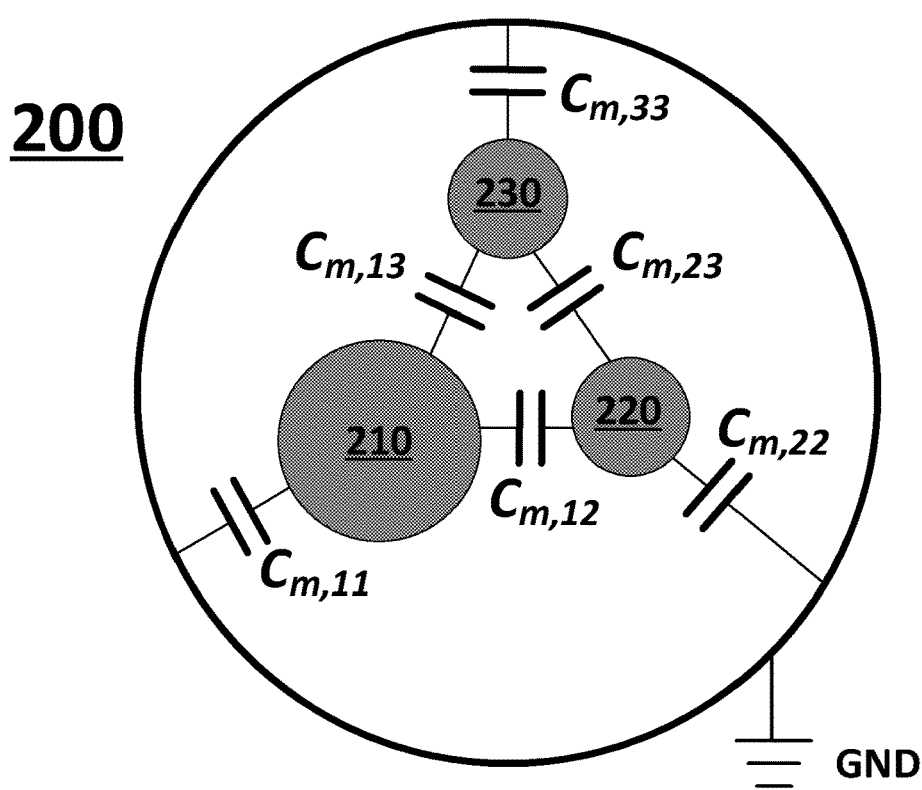
FIG. 2 is a schematic diagram illustrating a simplified model of an exemplary shielded multiple-conductor cable which is also applicable to a signal delay device according to an embodiment of the present disclosure.

FIG. 2 is a schematic diagram illustrating a simplified model of an exemplary shielded multiple-conductor cable 200 which is also applicable to a signal delay device according to an embodiment of the present disclosure. As shown in FIG. 2, three conductors (e.g., signal electrodes) 210, 220, and 230 are wrapped by a conducting shield and are insulated from each other. The mutual capacitances therebetween may comprise: a mutual capacitance $C_{m,12}$ between the signal electrode 210 and the signal electrode 220, a mutual capacitance $C_{m,13}$ between the signal electrode 210 and the signal electrode 230, and a mutual capacitance $C_{m,23}$ between the signal electrode 220 and the signal electrode 230. Further, the self-capacitances of the three signal electrodes 210, 220, and 230 (or their mutual capacitances relative to the ground "GND") may be referred to as $C_{m,11}$, $C_{m,22}$, and $C_{m,33}$, respectively.

From the above equations (4) and (4'), the Maxwell capacitance matrix for this cable 200 can be given as follows.

$$\begin{cases} C_{m,11} + C_{m,12} + C_{m,13} & -C_{m,12} & -C_{m,13} \\ -C_{m,12} & C_{m,12} + C_{m,22} + C_{m,23} & -C_{m,23} \\ -C_{m,13} & -C_{m,23} & C_{m,13} + C_{m,23} + C_{m,33} \end{cases} \quad (5)$$

Ideally, $$C_{m,11} + C_{m,12} + C_{m,13} = C_{m,12} + C_{m,22} + C_{m,23} = C_{m,13} + C_{m,23} + C_{m,33},$$

and two adjacent signal electrodes should not be coupled, which means $C_{m,12}=C_{m,13}=C_{m,23}=0$. Coupling between signal electrodes typically result in alternative propagation paths for a signal, which in turn results in deviation of the phase from linear. Therefore, one aim of a signal delay line design is to make $C_{m,12}$, $C_{m,13}$, and $C_{m,23}$ as small as possible.

Next, a detailed description of some embodiments of the present disclosure will be described with reference to FIG. 3-FIG. 8.

Figure 3:
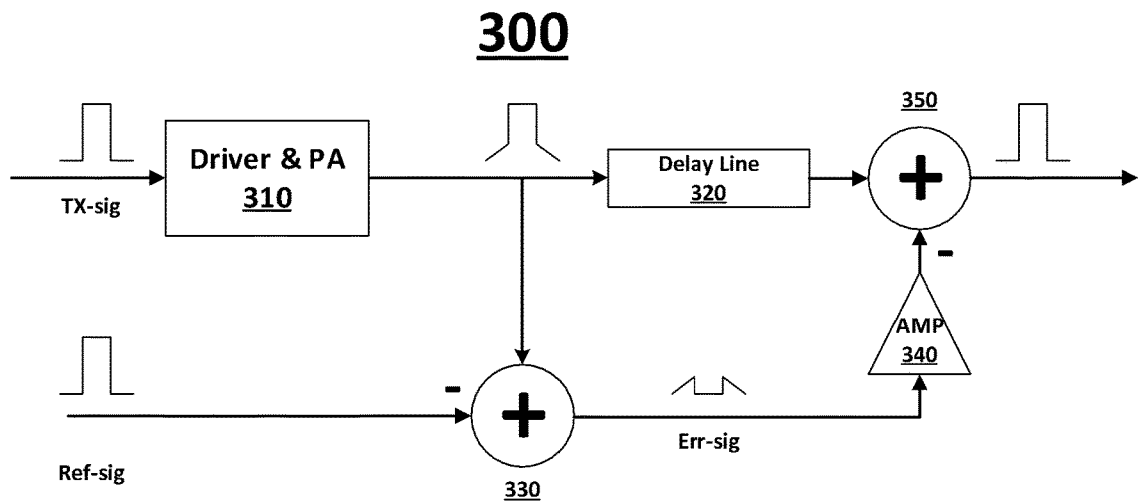
FIG. 3 is a schematic diagram illustrating an exemplary power amplifier according to an embodiment of the present disclosure.

FIG. 3 is a schematic diagram illustrating an exemplary power amplifier 300 according to an embodiment of the present disclosure. As shown in FIG. 3, the power amplifier 300 may comprise a driver & power amplifier (PA) 310, a delay line (or signal delay device) 320, an adder 330, an amplifier 340, and another adder 350.

As shown in FIG. 3, a signal to be transmitted "TX-sig" may be input to and processed by the driver & PA 310, such that an amplified signal with some distortion may be obtained. The amplified signal may be scaled down (for example, by coupling) and added with an inverted reference signal "Ref-sig" which has a same waveform as that of the TX-sig at the adder 330 to generate an error signal "Err-sig". The error signal Err-sig may then be amplified by the amplifier 340. After that, at the adder 350, an inverted version of the amplified error signal may be added to the amplified signal which is output from the driver & PA 310 and then delayed by the delay line 320, to generate an amplified and distortion-corrected signal.

Please note that the delay line 320 is necessary since the amplified signal output from the driver & PA 310 may be shifted from the amplified error signal in the time domain due to the delay introduced by the adder 330 and the amplifier 340. In other words, with the delay introduced by the delay line 320, the amplified signal output from the driver & PA 310 may be synchronized with the amplified error signal. However, the present disclosure is not limited thereto. In other words, a signal delay device according to an embodiment of the present disclosure may be applicable in any electronic devices in which signal delay is required, for example, the PA 300 shown in FIG. 3.

FIG. 4A-FIG. 4E show a front perspective view, a rear perspective view, a front view, a left side view, and a rear view of an exemplary signal delay device 400 according to an embodiment of the present disclosure, respectively. Next, the signal delay device 400 will be described in detail with reference to FIG. 4A-FIG. 4E.

As shown in FIG. 4A-FIG. 4E, the signal delay device 400 may have roughly a shape of a rectangular cuboid (hereinafter "cuboid" for simplicity). However, the present disclosure is not limited thereto. In some other embodiments, the signal delay device 400 may have other shapes, for example, a sphere, a pyramid, a cube, a cylinder, a prism, or any other regular or irregular shapes.

Referring to FIG. 4A to FIG. 4E, the signal delay device 400 may have a frame 401 which is made of insulation material, e.g., ceramic. The frame 401 may have multiple surfaces comprising the top surface 401-T, the front surface 401-F, the rear surface 401-RE, the left side surface 401-L, the right side surface 401-RI, and the bottom surface 401-B (which cannot be seen from FIG. 4A to FIG. 4E). However, in some other embodiments in which the signal delay device 400 has a different shape, the signal delay device 400 may have less surfaces, more surfaces, or surfaces with different names, and therefore the present disclosure is not limited to the embodiments shown and described herein.

In some embodiments, the frame 401 may be coated or otherwise covered by a layer of conductive material, such as silver, and therefore can be regarded as the outer conductor which may be grounded as shown in FIG. 2. Therefore, in some embodiments, some outer surfaces of the frame 401, for example, the surfaces 401-T, 401-L, 401-RI, and 401-B, may have a conductive layer disposed thereon. In some embodiments, the conductive layer may cover these surfaces completely. In some other embodiments, the conductive layer may cover these surfaces partially and some conductive patterns may be formed thereon.

Figure 4A:
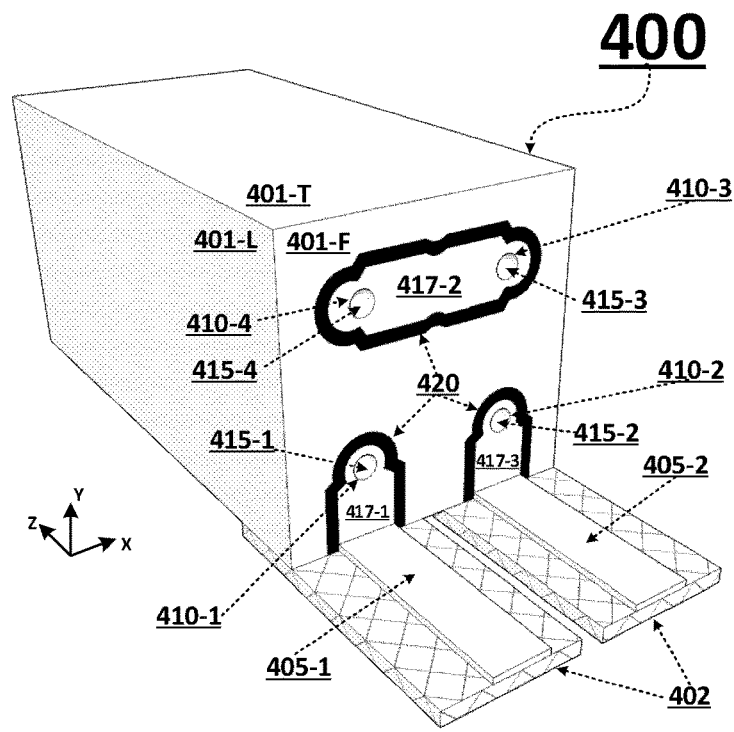
FIG. 4A-FIG. 4E show a front perspective view, a rear perspective view, a front view, a left side view, and a rear view of an exemplary signal delay device according to an embodiment of the present disclosure, respectively.
Figure 4B:
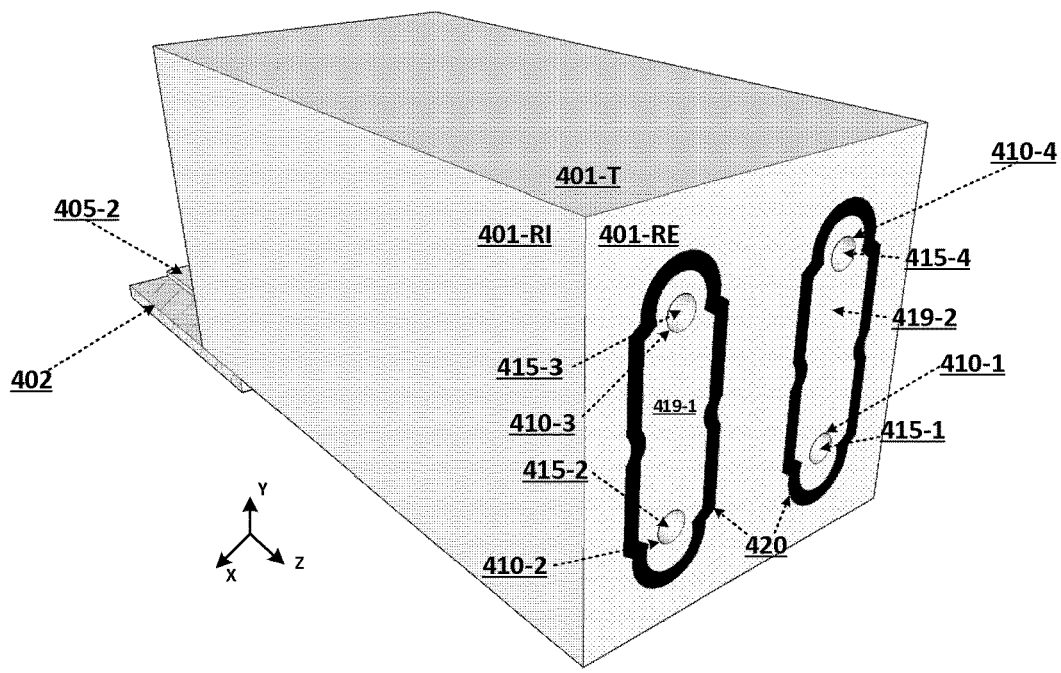
Figure 4C:
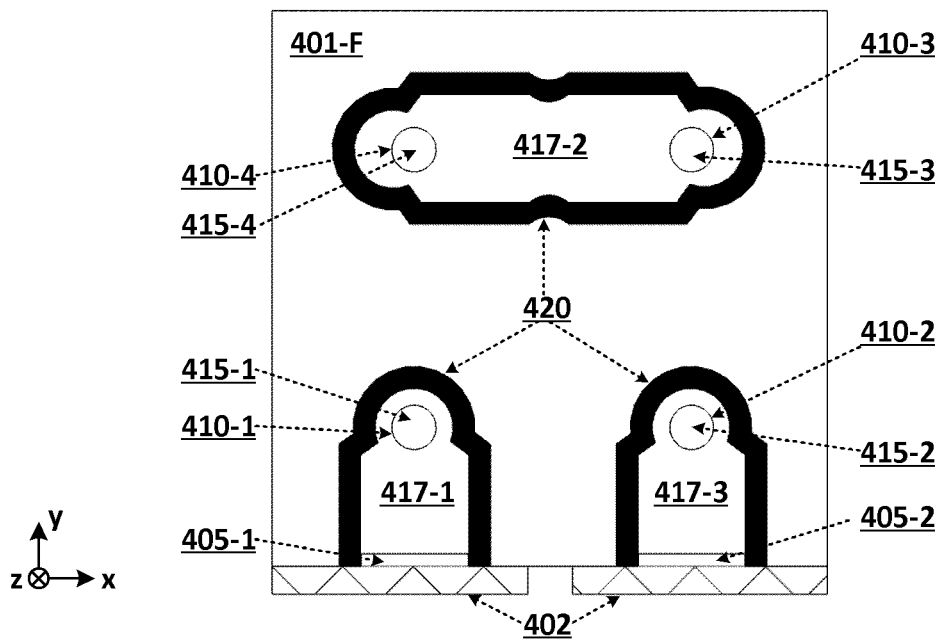
Figure 4D:
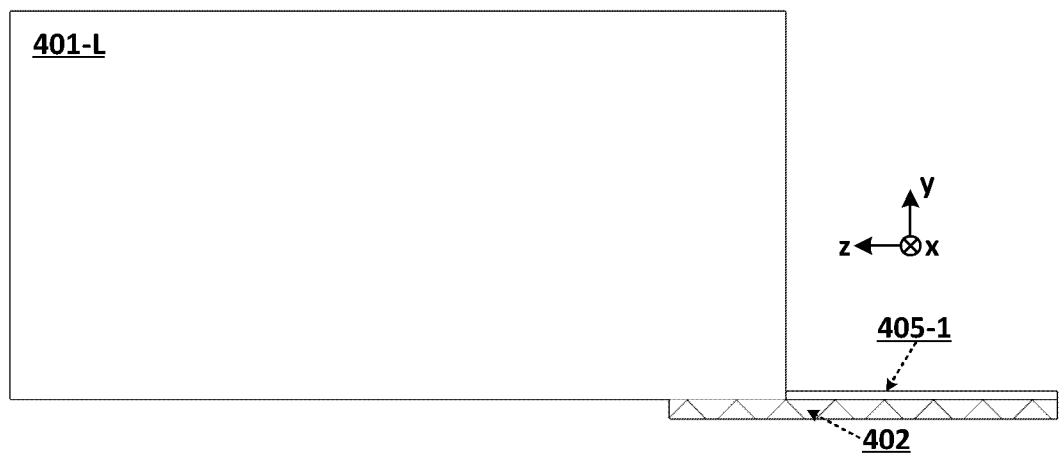
Figure 4E:
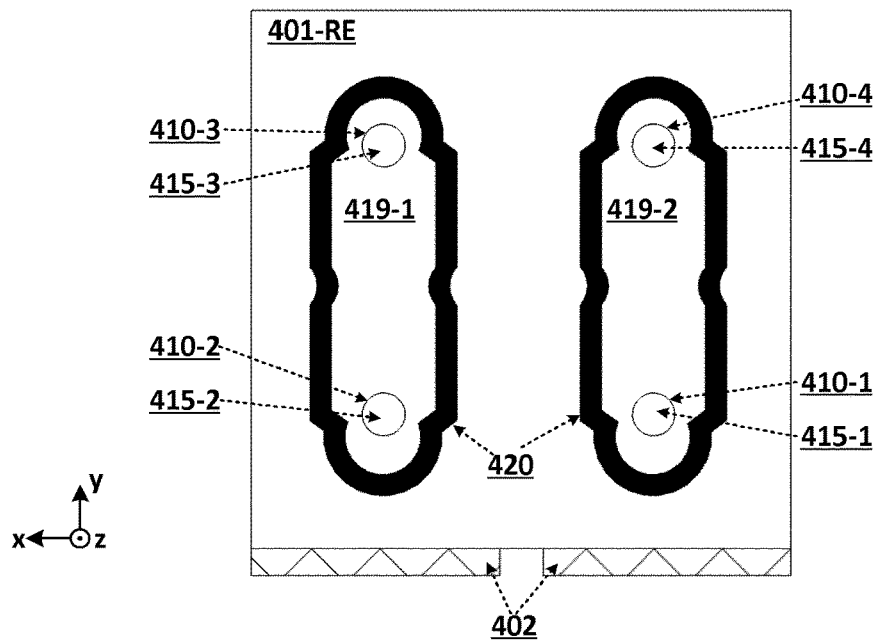

Further, as shown in FIG. 4A and FIG. 4B, some regions of the conductive layer may be cut off (e.g., by laser) or otherwise removed from the front surface 401-F and/or the rear surface 401-RE to form one or more insulating patterns, for example, the insulating patterns 420 on the front surface 401-F and the rear surface 401-RE, which are shown as black patterns as can be seen from FIG. 4A-FIG. 4E. These insulating patterns 420 may separate and electrically insulate their inner area from their outer area. For example, the insulating pattern 420 which surrounds two holes 415-3 and 415-4 on the front surface 401-F may electrically insulate a conductive pattern 417-2 from other part of the conductive layer on the front surface 401-F. For another example, the insulating pattern 420 which surrounds two holes 415-1 and 415-4 on the rear surface 401-RE may electrically insulate a conductive pattern 419-2 from other part of the conductive layer on the rear surface 401-RE. In other words, the front surface 401-F and/or the rear surface 401-RE may have a conductive layer disposed thereon which may be insulated from the conductive patterns 417 and/or 419.

Further, as shown in FIG. 4A and FIG. 4B, multiple signal electrodes 410-1, 410-2, 410-3, and 410-4 may be provided in the frame 401 and may be electrically connected to each other in series. For example, as shown in FIG. 4A and FIG. 4B, the frame 401 may have one or more holes 415-1, 415-2, 415-3, and 415-4, and each of the holes 415-1, 415-2, 415-3, and 415-4 may have an opening on the front surface 401-F and another opening on the rear surface 401-RE which is opposed to the front surface 401-F. In other words, these holes 415-1, 415-2, 415-3, and 415-4 may be through holes between the front surface 401-F and the rear surface 401-RE. Although the inside of the holes 415-1, 415-2, 415-3, and 415-4 cannot be observed in FIG. 4A to FIG. 4E directly, these holes 415-1, 415-2, 415-3, and 415-4 could be straight holes, curved holes, and holes with any regular or irregular inner surface shapes. For simplicity, the holes 415-1, 415-2, 415-3, and 415-4 may be straight holes in the embodiment shown in FIG. 4A to FIG. 4E. However, the present disclosure is not limited thereto.

As also shown in FIG. 4A and FIG. 4B, a first signal electrode 410-1 may be located in a first hole 415-1, a second signal electrode 410-2 may be located in a second hole 415-2, a third signal electrode 410-3 may be located in a third hole 415-3, and a fourth signal electrode 410-4 may be located in a fourth hole 415-4. Further, each of the multiple signal electrodes 410-1, 410-2, 410-3, and 410-4 may be a conductive pattern located on the inner surface of a corresponding hole 415-1, 415-2, 415-3, and 415-4. In some embodiments, each of the multiple signal electrodes 410-1, 410-2, 410-3, and 410-4 may be a layer of conductive material (e.g., silver) coated on the inner surface of a corresponding hole 415-1, 415-2, 415-3, and 415-4.

As shown in FIG. 4A and FIG. 4B, two signal electrodes may be electrically connected to each other via a conductive pattern on the front 401-F or rear surface 401-RE of the frame 401. For example, the first signal electrode 410-1 may be electrically connected to the fourth signal electrode 410-4 via a conductive pattern 419-2 on the rear surface 401-RE as clearly shown in FIG. 4B. For another example, the fourth signal electrode 410-4 may be electrically connected to the third signal electrode 410-3 via a conductive pattern 417-2 on the front surface 401-F as clearly shown in FIG. 4A. For yet another example, the third signal electrode 410-3 may be electrically connected to the second signal electrode 410-2 via a conductive pattern 419-1 on the rear surface 401-RE as clearly shown in FIG. 4B. In other words, the multiple signal electrodes may be electrically connected in series to form a multi-segment delay line, and each segment may be regarded as one of the inner conductors shown in FIG. 2. However, the electrical connections are not limited to those shown in FIG. 4A-FIG. 4E. In some other embodiments, the multiple signal electrodes may be connected in another manner. In some other embodiments, the first signal electrode 410-1 may be electrically connected to both of the third and fourth signal electrodes 410-3 and 410-4, which in turn are electrically connected to the second signal electrode 410-2, for example, via different conductive patterns provided on the front 401-F and rear surfaces 401-RE.

Further, as also shown in FIG. 4A, the signal delay device 400 may further comprise an input terminal 405-1 and an output terminal 405-2. The input terminal 405-1 may be electrically connected to the first signal electrode 410-1 via a conductive pattern 417-1 and configured to receive an input signal to be delayed. The output terminal 405-2 may be electrically connected to the second signal electrode 410-2 via another conductive pattern 417-3 and configured to output an output signal that is delayed by the multiple signal electrodes 410-1, 410-2, 410-3, and 410-4 with respect to the input signal.

Further, as shown in FIG. 4A and FIG. 4B, at least one (e.g., the third and fourth signal electrodes 410-3 and 410-4) of the multiple signal electrodes 410-1, 410-2, 410-3, and 410-4 may be located at a different height than those of other signal electrodes (e.g., the first and second signal electrodes 410-1 and 410-2) with respect to a surface 402 on which the device 400 is to be mounted. In some embodiments, the surface 402 may be a part of a PCB of the power amplifier 300 shown in FIG. 3. Therefore, comparing with a planar delay line design, a reduced area occupied on the PCB may be achieved with a similar delay performance.

Further, although four holes 415-1, 415-2, 415-3, and 415-4 with four signal electrodes 410-1, 410-2, 410-3, and 410-4 are shown in FIG. 4A-FIG. 4E, the present disclosure is not limited thereto. Depending on the delay requirements, any appropriate number of holes and/or signal electrodes may be provided in the signal delay device 400. Further, the shapes and/or sizes of any conductive patterns, insulating patterns, holes, and/or signal electrodes are not limited to those shown in FIG. 4A-FIG. 4E.

The signal delay device 400 shown in FIG. 4A-FIG. 4E is presented with the consideration (1) as mentioned above. That is, an arrangement of signal electrodes at different heights may be provided in FIG. 4A-FIG. 4E to reduce the area occupied by a signal delay device 400 on the PCB. Next, the consideration (2) mentioned above may be described with reference to FIG. 5A-FIG. 5E. In other words, additional holes in and/or grooves on a signal delay device may be introduced to reduce the coupling between signal electrodes and subsequently to reduce group delay ripple.

FIG. 5A-FIG. 5E show a front perspective view, a rear perspective view, a front view, a left side view, and a rear view of an exemplary signal delay device 500 according to an embodiment of the present disclosure, respectively. Next, the signal delay device 500 will be described in detail with reference to FIG. 5A-FIG. 5E.

First, please note that the embodiment shown in FIG. 5A-FIG. 5E is an improved embodiment with respect to that shown in FIG. 4A-FIG. 4E, and therefore repeated description of similar elements with similar reference numerals may be omitted for simplicity.

As shown in FIG. 5A-FIG. 5E, the signal delay device 500 may also have roughly a shape of a cuboid, which is similar to that of the signal delay device 400. Further, the signal delay device 500 may have a frame 501 which is made of insulation material, e.g., ceramic. The frame 501 may have multiple surfaces, which are named in a similar fashion as those shown in FIG. 4A to FIG. 4E, that is, the top surface 501-T, the front surface 501-F, the rear surface 501-RE, the left side surface 501-L, the right side surface 501-RI, and the bottom surface 501-B (which cannot be seen from FIG. 5A to FIG. 5E).

In some embodiments, the frame 501 may be coated or otherwise covered by a layer of conductive material, such as silver, and therefore can be regarded as the outer conductor shown in FIG. 2, which may be grounded. Therefore, in some embodiments, some outer surfaces of the frame 501, for example, the surfaces 501-T, 501-L, 501-RI, and 501-B, may have a conductive layer disposed thereon. In some embodiments, the conductive layer may cover these surfaces completely. In some other embodiments, the conductive layer may cover these surfaces partially and some conductive patterns may be formed thereon.

Figure 5A:
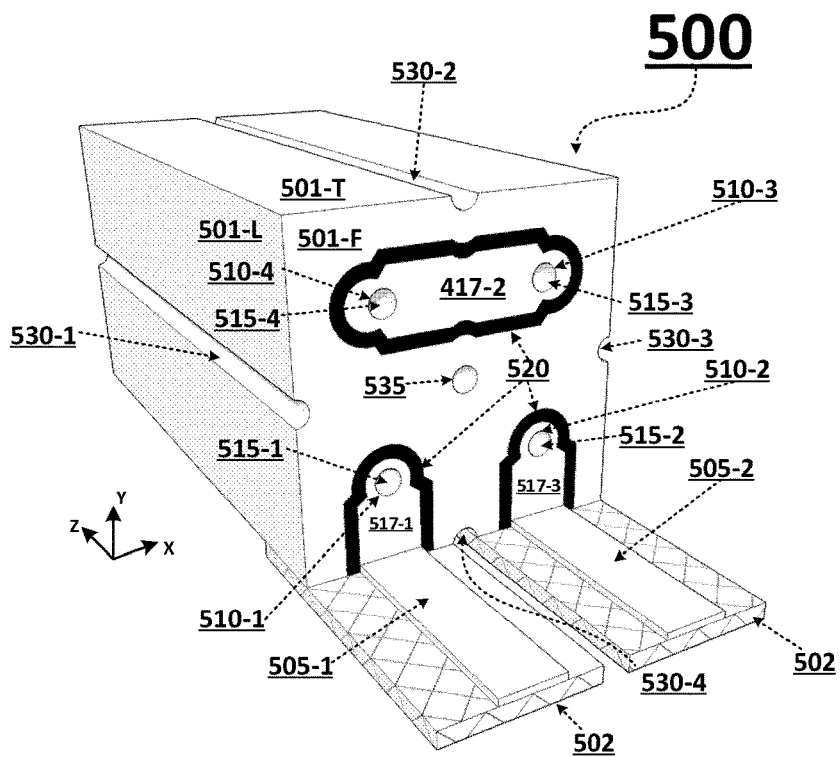
FIG. 5A-FIG. 5E show a front perspective view, a rear perspective view, a front view, a left side view, and a rear view of another exemplary signal delay device according to another embodiment of the present disclosure, respectively.
Figure 5B:
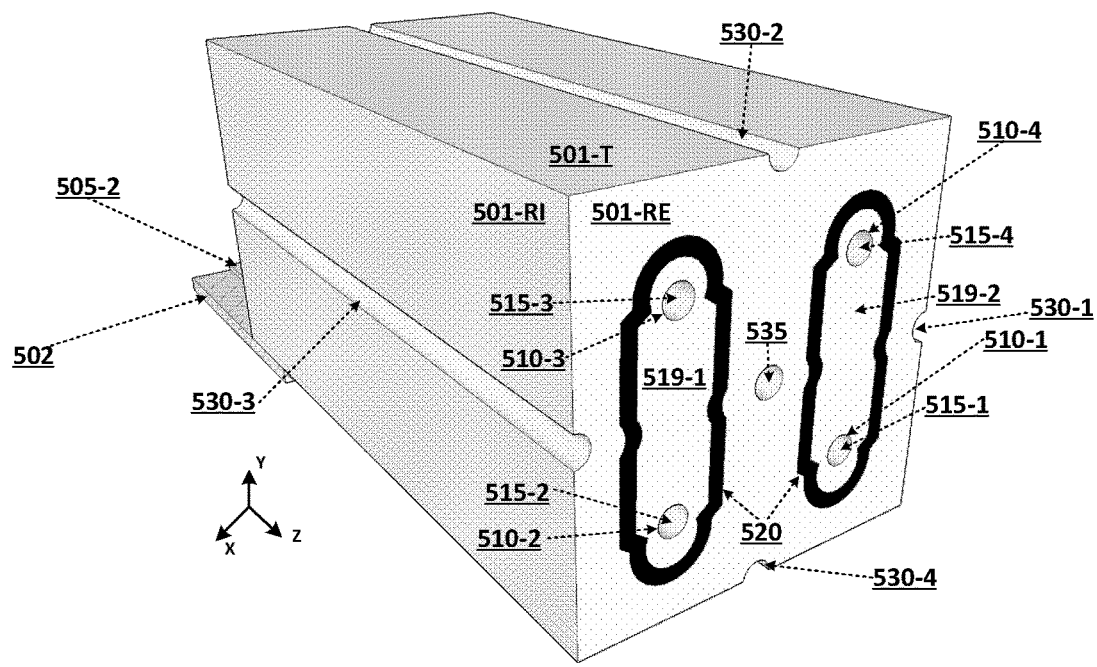
Figure 5C:
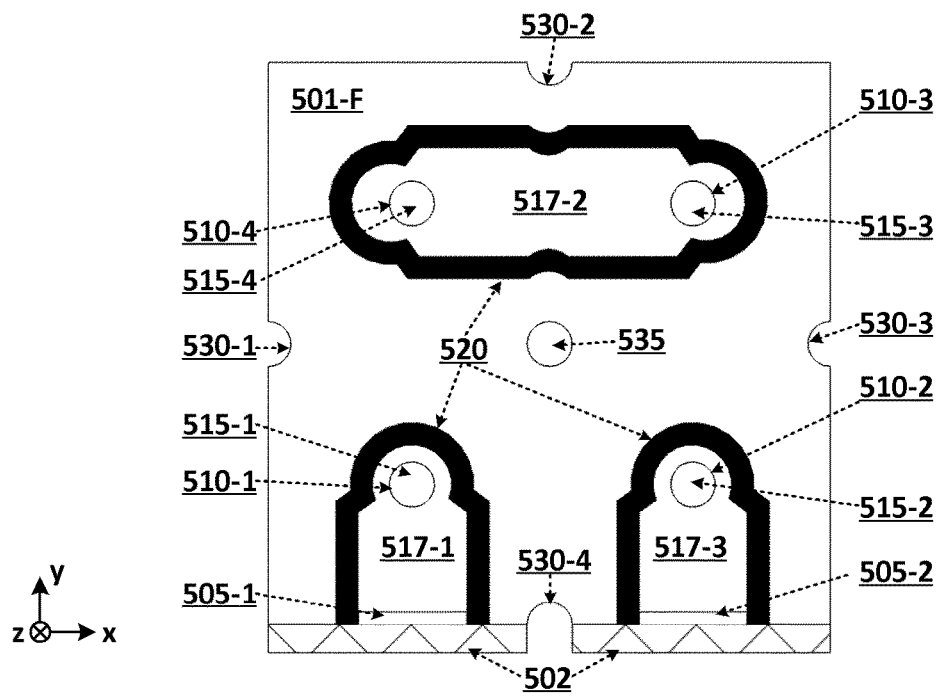
Figure 5D:
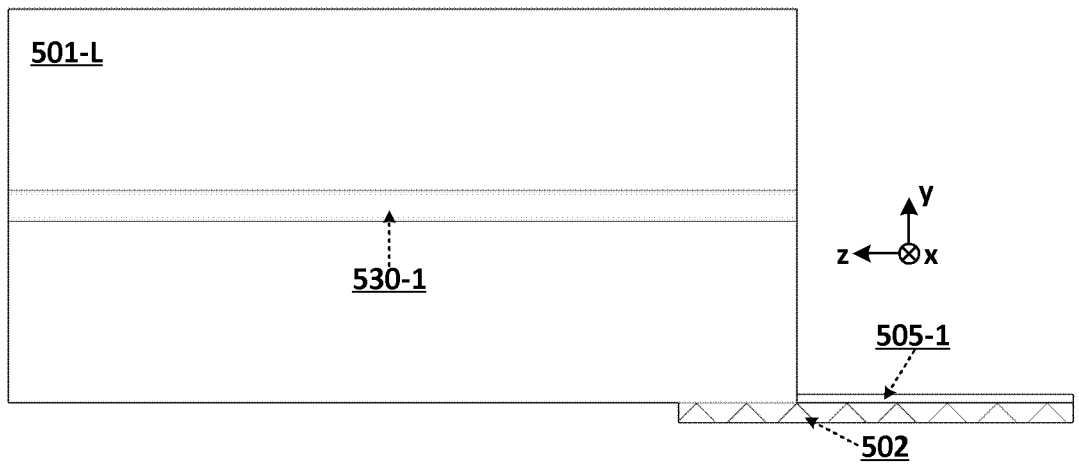
Figure 5E:
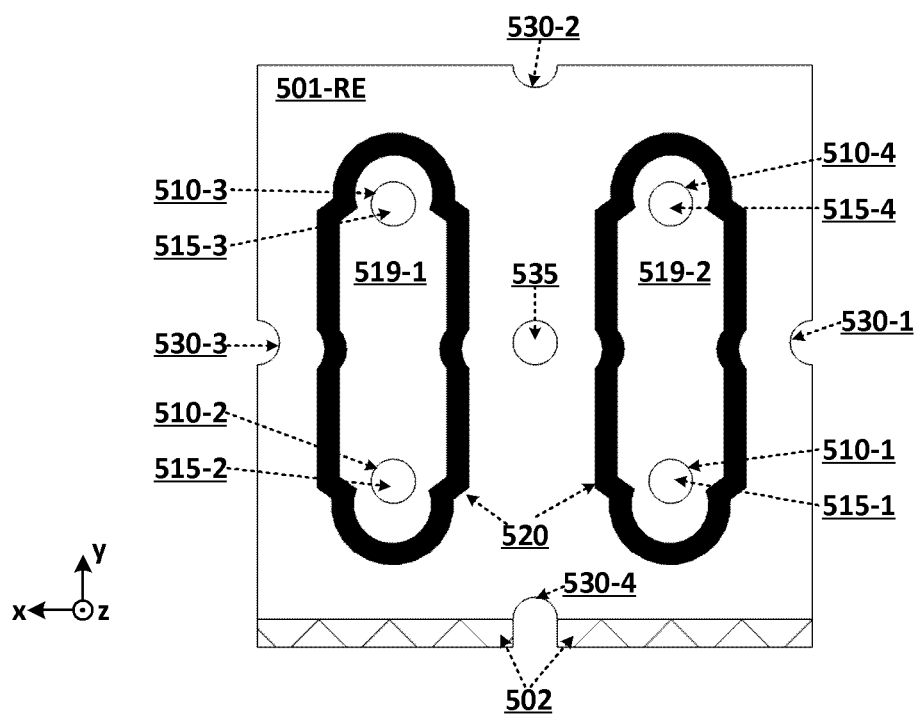

Further, as shown in FIG. 5A and FIG. 5B, some regions of the conductive layer may be cut off or otherwise removed from the front surface 501-F and/or the rear surface 501-RE to form one or more insulating patterns, for example, the insulating patterns 520 on the front surface 501-F and the rear surface 501-RE, which are shown as black patterns as can be seen from FIG. 5A-FIG. 5E. These insulating patterns may separate and electrically insulate their inner area from their outer area. Further, as shown in FIG. 5A and FIG. 5B, multiple signal electrodes 510-1, 510-2, 510-3, and 510-4 may be provided in the frame 501 and may be electrically connected to each other in series. For example, as shown in FIG. 5A and FIG. 5B, the frame 501 may have one or more holes 515-1, 515-2, 515-3, and 515-4, and each of the holes 515-1, 515-2, 515-3, and 515-4 may have an opening on the front surface 501-F and another opening on the rear surface 501-RE which is opposed to the front surface 501-F.

As also shown in FIG. 5A and FIG. 5B, a first signal electrode 510-1 may be located in a first hole 515-1, a second signal electrode 510-2 may be located in a second hole 515-2, a third signal electrode 510-3 may be located in a third hole 515-3, and a fourth signal electrode 510-4 may be located in a fourth hole 515-4. Further, each of the multiple signal electrodes 510-1, 510-2, 510-3, and 510-4 may be a conductive pattern located on the inner surface of a corresponding hole 515-1, 515-2, 515-3, and 515-4. In some embodiments, each of the multiple signal electrodes 510-1, 510-2, 510-3, and 510-4 may be a layer of conductive material (e.g., silver) coated on the inner surface of a corresponding hole 515-1, 515-2, 515-3, and 515-4. As shown in FIG. 5A and FIG. 5B, two signal electrodes may be electrically connected to each other via a conductive pattern on the front 501-F or rear surface 501-RE of the frame 501. In other words, the multiple signal electrodes may be electrically connected in series to form a multi-segment delay line, and each segment may be regarded as one of the inner conductors shown in FIG. 2. However, the connections are not limited to those shown in FIG. 5A-FIG. 5E. In some other embodiments, the multiple signal electrodes may be connected in another manner.

Further, as also shown in FIG. 5A, the signal delay device 500 may further comprise an input terminal 505-1 and an output terminal 505-2. The input terminal 505-1 may be electrically connected to the first signal electrode 510-1 via a conductive pattern 517-1 and configured to receive an input signal to be delayed. The output terminal 505-2 may be electrically connected to the second signal electrode 510-2 via another conductive pattern 517-3 and configured to output an output signal that is delayed by the multiple signal electrodes 510-1, 510-2, 510-3, and 510-4 with respect to the input signal.

Further, as shown in FIG. 5A and FIG. 5B, at least one (e.g., the third and fourth signal electrodes 510-3 and 510-4) of the multiple signal electrodes 510-1, 510-2, 510-3, and 510-4 may be located at a different height than those of other signal electrodes (e.g., the first and second signal electrodes 510-1 and 510-2) with respect to a surface 502 on which the device 500 is to be mounted. In some embodiments, the surface 502 may be a part of a PCB of the power amplifier 300 shown in FIG. 3. Therefore, comparing with a planar delay line design, a reduced area occupied on the PCB may be achieved with a similar delay performance.

Further, as shown in FIG. 5A-FIG. 5E, there may be one or more grooves 530-1, 530-2, 530-3, 530-4 on at least one of the outer surfaces of the frame 501 other than the front surface 501-F and the rear surface 501-RE, such that each of the grooves 530-1, 530-2, 530-3, 530-4 may reduce the cross-sectional area between adjacent signal electrodes. As mention earlier, a mutual capacitance is typically a function of the overlapped area of the two objects which is viewed form their orthogonal or normal direction, the distance between them, and the dielectric of the material that separates them. For example, a capacitance C for two separated conducting plates may be calculated as follows:

$$C = \frac{\varepsilon S}{4\pi k d} \quad (6)$$

where ε refers to the permittivity of the dielectric material between the two plates, S refers to the overlapped area of the two plates which is viewed in a direction orthogonal to the plates (that is, the normal direction of the plates), k is a constant, and d refers to the distance between the two plates. Therefore, by reducing the cross-sectional area between adjacent signal electrodes, the effective overlapped area of the two signal electrodes are reduced by the conducting material in the grooves 530-1, 530-2, 530-3, and 530-4, resulting in a reduced mutual capacitance of the two signal electrodes.

As shown in FIG. 5A-FIG. 5E, at least one of the grooves 530-1, 530-2, 530-3, and 530-4 may have a cross section of a circular segment. In some embodiments, all of the grooves 530-1, 530-2, 530-3, and 530-4 may have a cross section of a circular segment. As shown in FIG. 5A-FIG. 5E, at least one of the grooves 530-1, 530-2, 530-3, and 530-4 may have a cross section of a semi-circle. In some embodiments, all of the grooves 530-1, 530-2, 530-3, and 530-4 may have a cross section of a semi-circle. An advantage of the circular segment or semi-circle is that the machining of the grooves will become more easier since the frame 501 may be made of ceramic which is fragile and may be difficult to be manufactured with other kinds of cross-section. However, in some other embodiments, the cross section of the grooves may have other shapes, such as, square, rectangle, trapezoid, parallelogram, or any other regular or irregular shapes.

Further, as shown in FIG. 5A and FIG. 5B, the frame 501 may have one or more additional holes 535, and each of the additional holes 535 may have an opening on the front surface 501-F and another opening on the rear surface 501-RE, such that each of the additional holes 535 may reduce the cross-sectional area between adjacent signal electrodes 510-1, 510-2, 510-3, and 510-4 as well. With a similar reason, the additional holes 530 may further reduce the mutual capacitances between adjacent signal electrodes 510-1, 510-2, 510-3, and 510-4, and therefore may improve its delay performance.

Figure 7:
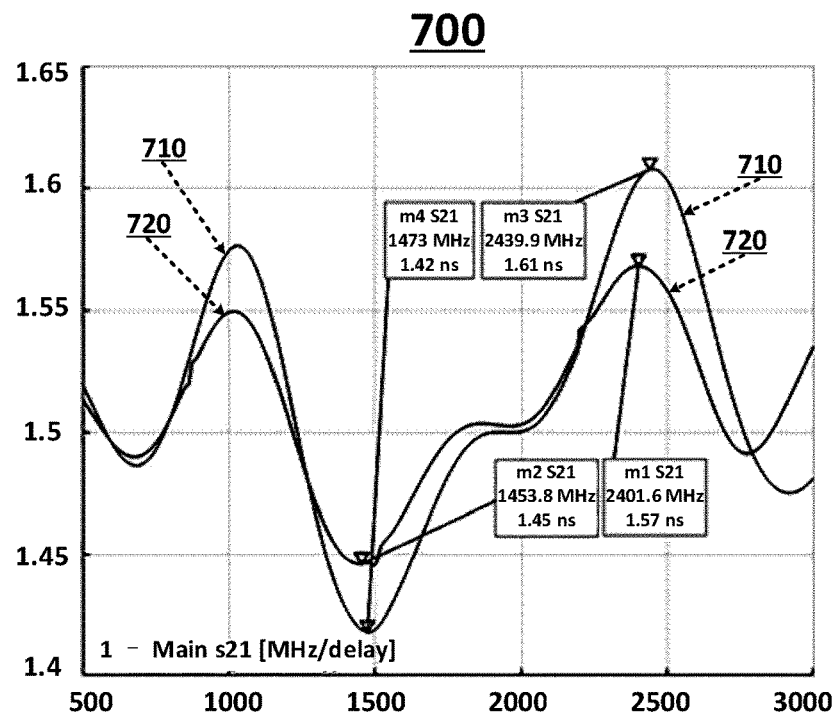
FIG. 7 is a diagram illustrating a comparison between simulation results for an exemplary signal delay device shown in FIG. 4A-FIG. 4E and another signal delay device shown in FIG. 5A-FIG. 5E.

FIG. 7 is a diagram illustrating a comparison between simulation results for an exemplary signal delay device 400 shown in FIG. 4A-FIG. 4E and another signal delay device 500 shown in FIG. 5A-FIG. 5E. As can be seen from FIG. 7, the delay graph 720 for the signal delay device 500 has a better delay performance than that of the delay graph 710 for the signal delay device 400 in terms of its delay ripples. For example, the delay graph 720 has a much more flattened curve than that of the delay graph 710.

The signal delay device 500 shown in FIG. 5A-FIG. 5E is presented with the considerations (1) and (2) as mentioned above. That is, an arrangement of signal electrodes at different heights, additional holes and grooves may be provided in FIG. 5A-FIG. 5E to reduce the area occupied on the PCB and reduce the mutual capacitance between adjacent signal electrodes. Next, the consideration (3) mentioned above may be described with reference to FIG. 6A-FIG. 6G. In other words, an impedance matching circuit may be provided on a signal delay device and reduce group delay ripple further.

FIG. 6A-FIG. 6G show a front perspective view, a rear perspective view, a bottom perspective view, a front view, a left side view, a rear view, and a bottom view of an exemplary signal delay device 600 according to an embodiment of the present disclosure, respectively. Next, the signal delay device 600 will be described in detail with reference to FIG. 6A-FIG. 6G.

First, please note that the embodiment shown in FIG. 6A-FIG. 6G is a further improved embodiment with respect to those shown in FIG. 4A-FIG. 4E and FIG. 5A-FIG. 5E, and therefore repeated description of similar elements with similar reference numerals may be omitted for simplicity.

As shown in FIG. 6A-FIG. 6G, the signal delay device 600 may have roughly a shape of a cuboid, which is similar to the signal delay device 400 or 500. Further, the signal delay device 600 may have a frame 601 which is made of insulation material, e.g., ceramic. The frame 601 may have multiple surfaces, which are named in a similar fashion as those shown in FIG. 4A to FIG. 4E and FIG. 5A to FIG. 5E, that is, the top surface 601-T, the front surface 601-F, the rear surface 601-RE, the left side surface 601-L, the right side surface 601-RI, and the bottom surface 601-B.

In some embodiments, the frame 601 may be coated or otherwise covered by a layer of conductive material, such as silver, and therefore can be regarded as the outer conductor which may be grounded as shown in FIG. 2. Therefore, in some embodiments, some outer surfaces of the frame 601, for example, the surfaces 601-T, 601-L, 601-RI, and 601-B, may have a conductive layer disposed thereon. In some embodiments, the conductive layer may cover these surfaces completely. In some other embodiments, the conductive layer may cover these surfaces partially and some conductive patterns may be formed thereon.

Figure 6A:
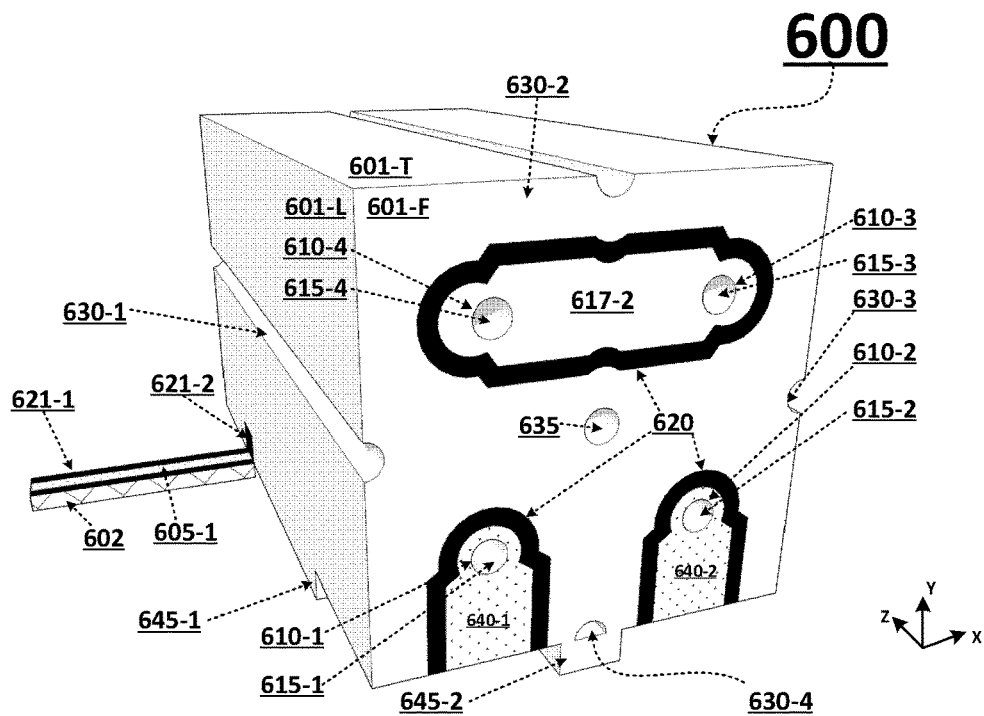
FIG. 6A-FIG. 6G show a front perspective view, a rear perspective view, a bottom perspective view, a front view, a left side view, a rear view, and a bottom view of yet another exemplary signal delay device according to yet another embodiment of the present disclosure, respectively.
Figure 6B:
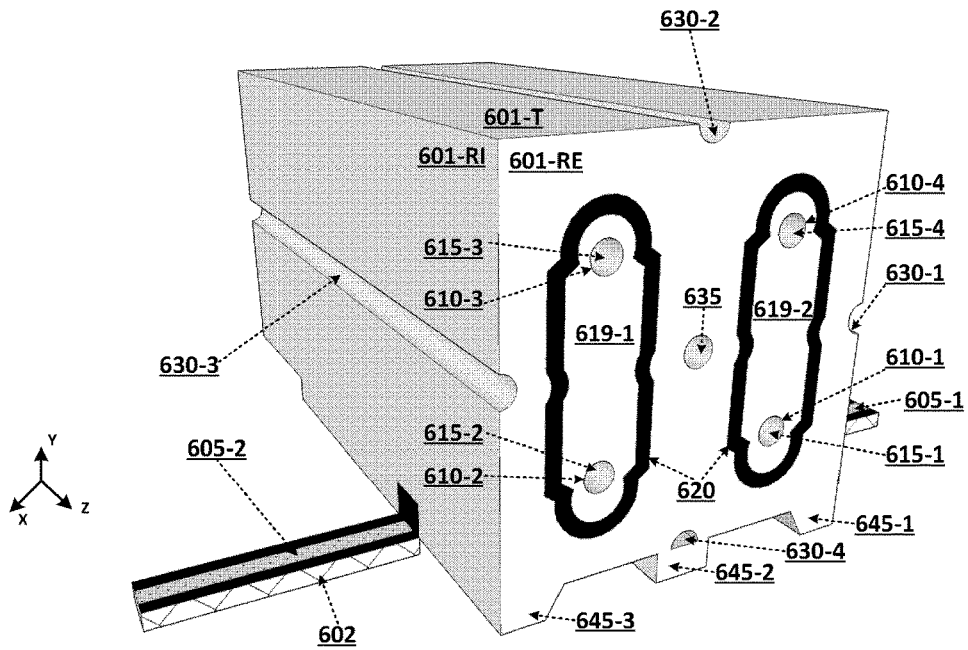

Further, as shown in FIG. 6A and FIG. 6B, some regions of the conductive layer may be cut off or otherwise removed from the front surface 601-F and/or the rear surface 601-RE to form one or more insulating patterns, for example, the insulating patterns 620 on the front surface 601-F, the rear surface 601-RE, and the bottom surface 601-B, which are shown as black patterns as can be seen from FIG. 6A-FIG. 6G. These insulating patterns may separate and electrically insulate their inner area from their outer area. Further, as shown in FIG. 6A and FIG. 6B, multiple signal electrodes 610-1, 610-2, 610-3, and 610-4 may be provided in the frame 601 and may be electrically connected to each other in series. For example, as shown in FIG. 6A and FIG. 6B, the frame 601 may have one or more holes 615-1, 615-2, 615-3, and 615-4, and each of the holes 615-1, 615-2, 615-3, and 615-4 may have an opening on the front surface 601-F and another opening on the rear surface 601-RE which is opposed to the front surface 601-F.

As also shown in FIG. 6A and FIG. 6B, a first signal electrode 610-1 may be located in a first hole 615-1, a second signal electrode 610-2 may be located in a second hole 615-2, a third signal electrode 610-3 may be located in a third hole 615-3, and a fourth signal electrode 610-4 may be located in a fourth hole 615-4. Further, each of the multiple signal electrodes 610-1, 610-2, 610-3, and 610-4 may be a conductive pattern located on the inner surface of a corresponding hole 615-1, 615-2, 615-3, and 615-4. In some embodiments, each of the multiple signal electrodes 610-1, 610-2, 610-3, and 610-4 may be a layer of conductive material (e.g., silver) coated on the inner surface of a corresponding hole 615-1, 615-2, 615-3, and 615-4. As shown in FIG. 6A and FIG. 6B, two signal electrodes may be electrically connected to each other via a conductive pattern on the front 601-F or rear surface 601-RE of the frame 601. In other words, the multiple signal electrodes may be electrically connected in series to form a multi-segment delay line, and each segment may be regarded as one of the inner conductors shown in FIG. 2. However, the connections are not limited to those shown in FIG. 6A-FIG. 6G. In some other embodiments, the multiple signal electrodes may be connected in another manner.

Further, as also shown in FIG. 6A and FIG. 6B, the signal delay device 600 may further comprise an input terminal 605-1 and an output terminal 605-2. The input terminal 605-1 may be electrically connected to the first signal electrode 610-1 via an impedance matching circuit or an impedance matching pattern 640-1 and configured to receive an input signal to be delayed. The output terminal 605-2 may be electrically connected to the second signal electrode 610-2 via another impedance matching circuit or an impedance matching pattern 640-2 and configured to output an output signal that is delayed by the multiple signal electrodes 610-1, 610-2, 610-3, and 610-4 with respect to the input signal. Further, the signal delay device 600 may comprise one or more insulating patterns 621-1 and 621-2 as shown in FIG. 6A, to insulate the input terminal 605-1 from the conductive layer on the left surface 601-L and/or any nearby conductor potentially mounted on the surface 602. Similarly, the signal delay device 600 may comprise one or more insulating patterns as shown in FIG. 6B, to insulate the output terminal 605-2 from the conductive layer on the right surface 601-RI and/or any nearby conductor potentially mounted on the surface 602. In some embodiments, the insulating pattern 621-2 may be formed in a similarly manner as that for the insulating patterns 620.

Further, as shown in FIG. 6A and FIG. 6B, at least one (e.g., the third and fourth signal electrodes 610-3 and 610-4) of the multiple signal electrodes 610-1, 610-2, 610-3, and 610-4 may be located at a different height than those of other signal electrodes (e.g., the first and second signal electrodes 610-1 and 610-2) with respect to a surface 602 on which the device 600 is to be mounted. In some embodiments, the surface 602 may be a part of a PCB of the power amplifier 300 shown in FIG. 3. Therefore, comparing with a planar delay line design, a reduced area occupied on the PCB may be achieved with a similar delay performance.

Further, as shown in FIG. 6A-FIG. 6G, there may be one or more grooves 630-1, 630-2, 630-3, 630-4 on at least one of the outer surfaces of the frame 601 other than the front surface 601-F and the rear surface 601-RE, such that each of the grooves 630-1, 630-2, 630-3, 630-4 may reduce the cross-sectional area between adjacent signal electrodes. Further, as shown in FIG. 6A and FIG. 6B, the frame 601 may have one or more additional holes 635, and each of the additional holes 635 may have an opening on the front surface 601-F and another opening on the rear surface 601-RE, such that each of the additional holes 635 may further reduce the cross-sectional area between adjacent signal electrodes 610-1, 610-2, 610-3, and 610-4.

Figure 6C:
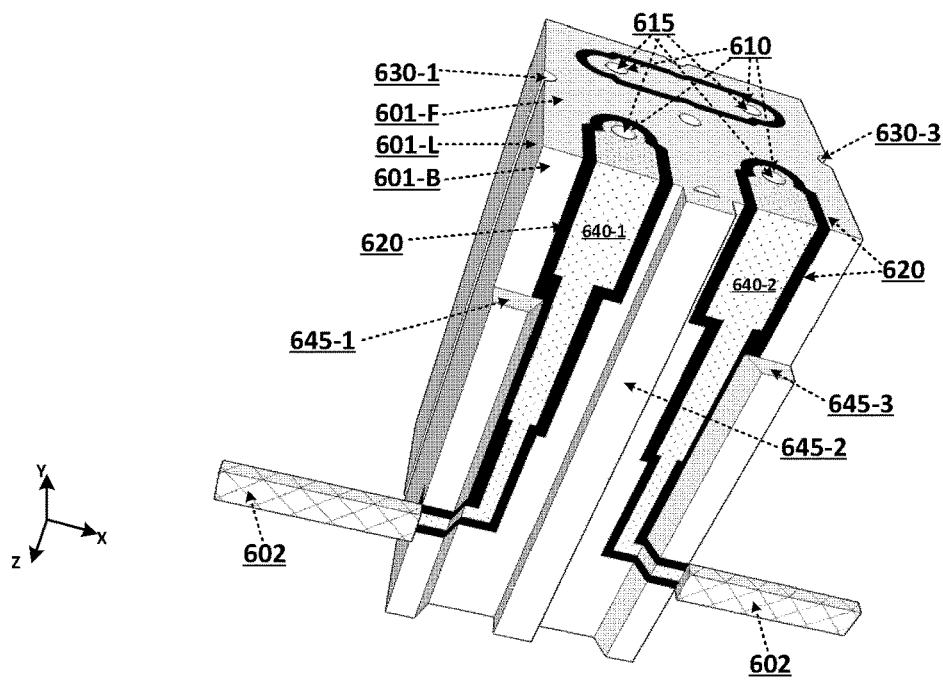
Figure 6D:
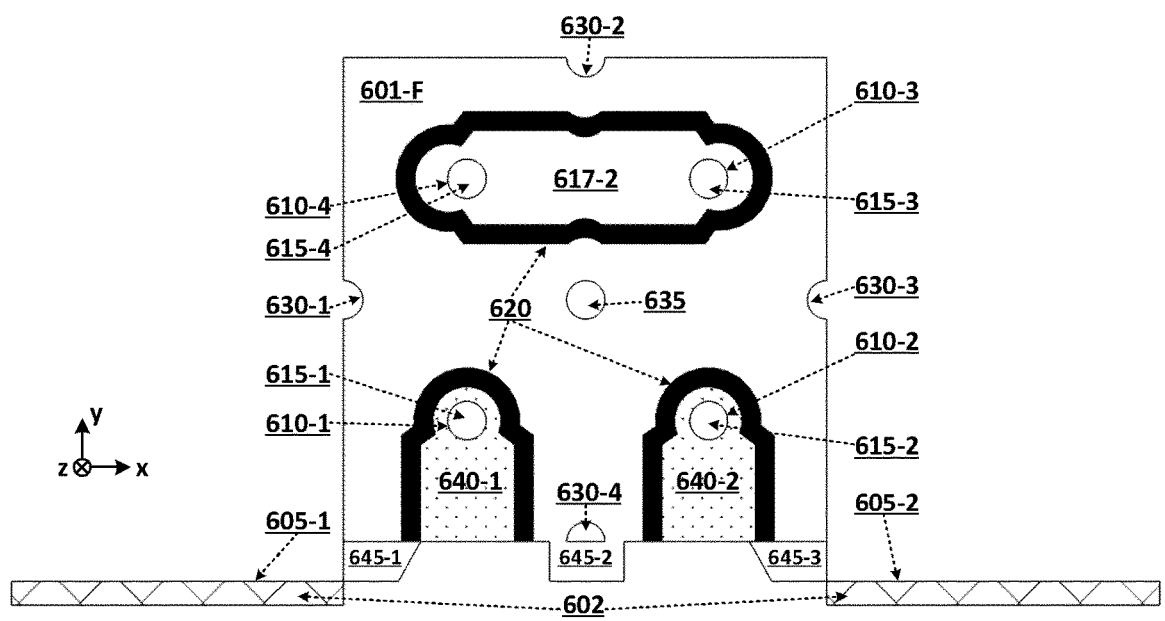
Figure 6E:
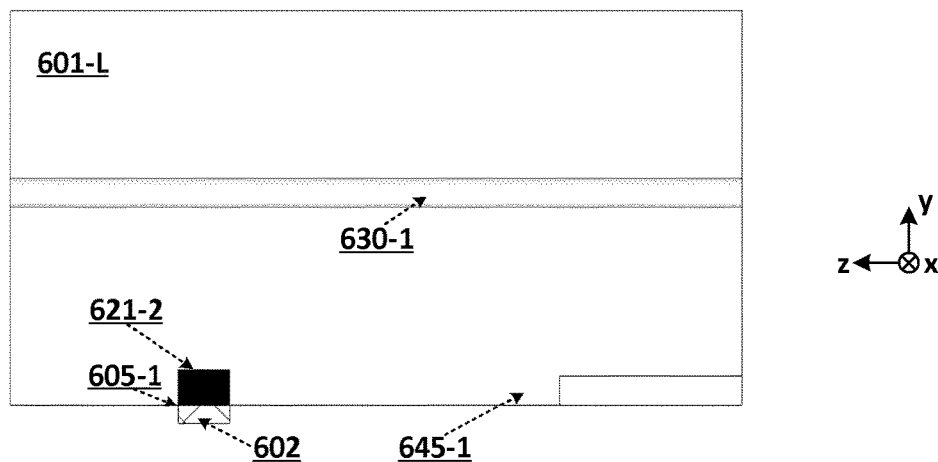
Figure 6F:
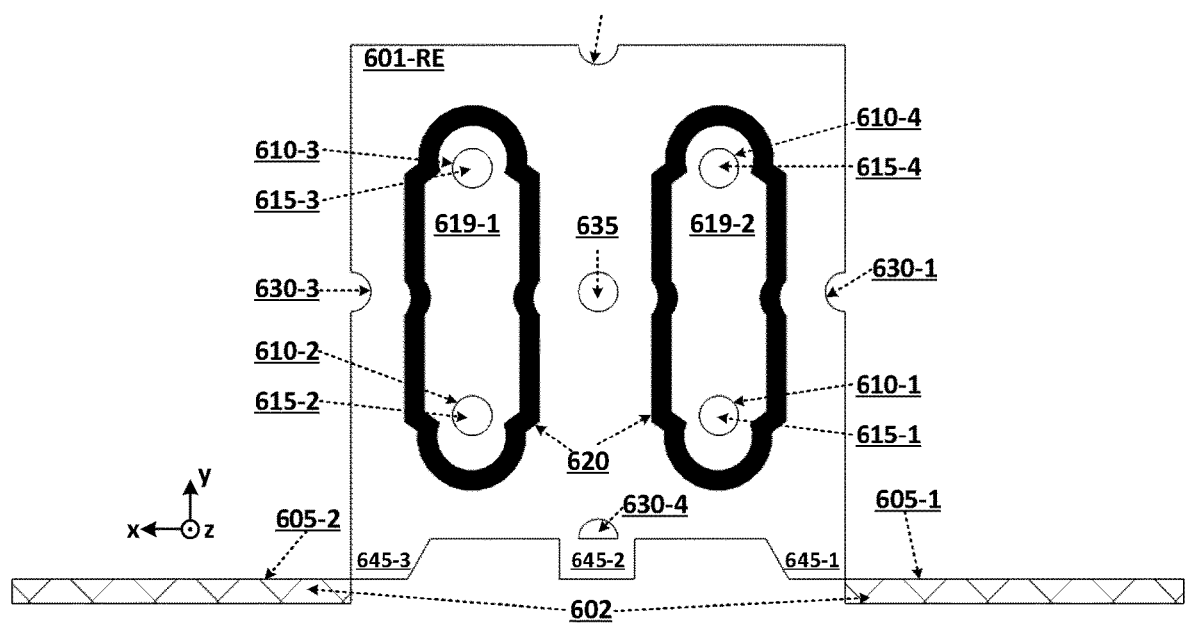
Figure 6G:
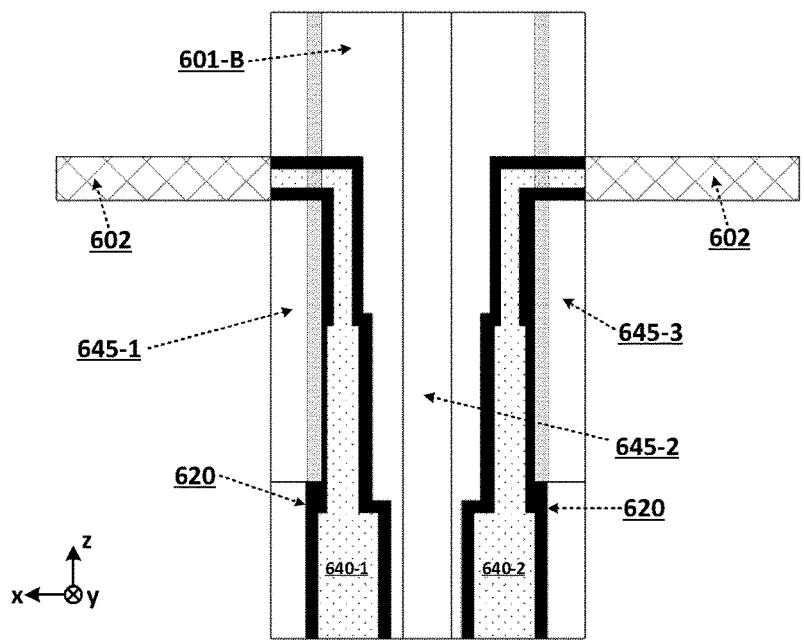

Further, as shown in FIG. 6A, FIG. 6C, FIG. 6G, the signal delay device 600 may comprise the impedance matching circuits or patterns 640-1 and 640-2 located on the front surface 601-F and/or the bottom surface 601-B of the signal delay device 600 and/or in the signal delay device 600 and configured to match the impedance of the signal delay device 600 with an impedance of a circuit (e.g., the PA 300 shown in FIG. 3) with which the signal delay device 600 is to be electrically coupled. For example, the matching circuits 640-1 and 640-2 may be implemented on the front surface 601-F and/or the bottom surface 601-B of the frame 601 to further decrease the size of delay line. Although FIG. 6A-FIG. 6G show that the impedance matching circuits 640-1 and 640-2 are provided on the front surface 601-F and the bottom surface 601-B, the present disclosure is not limited thereto. In some other embodiments, the impedance matching circuits 640-1 and 640-2 may be provided on one or more other surfaces, inside the signal delay device 600, or partially on the outer surfaces and partially inside the device 600. The present disclosure is not limited to the embodiments shown in FIG. 6A-FIG. 6G.

Further, as clearly shown in FIG. 6A-FIG. 6G, the signal delay device 600 may further comprise one or more feet 645-1, 645-2, and 645-3 (collectively, the feet 645). In some embodiments, the feet 645 may separate the impedance matching circuits or patterns 640-1 and 640-2 from the surface 602, such that an air gap may be formed between the impedance matching pattern 640-1 and 640-2 and the surface 602. Please note that the part of the surface 602 which is directly under the signal delay device 600 is not shown for the purpose of clarity.

As shown FIG. 6C, the impedance matching circuits 640-1 and 640-2 may continuously extend from the front surface 601-F to the bottom surface 601-B, then to the feet 645-1 and 645-3, and finally to the input terminal 605-1 and the output terminal 605-2, respectively, and they may have shapes and/or sizes to match the impedance of the signal delay device 600 with the impedances of the circuits to which the input terminal 605-1 and the output terminals 605-2 are to be electrically coupled, respectively. Further, the insulating patterns 620 may insulate the impedance matching circuits 640-1 and 640-2 from the conductive layers on the front surface 601-T and the bottom surface 601-B.

With this configuration, the input terminal 605-1 and the output terminal 605-2 are provided on the left 601-L and right surfaces 601-RI, which are different from those shown in FIGS. 4A-4E and FIGS. 5A-5E.

Figure 8:
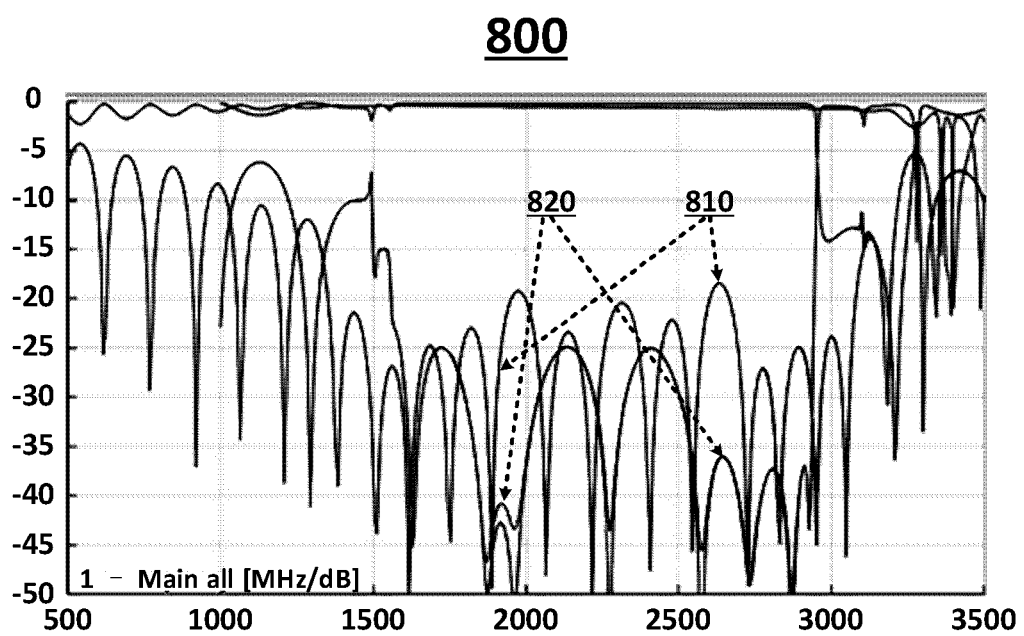
FIG. 8 is a diagram illustrating a comparison between simulation results for an exemplary signal delay device shown in FIG. 5A-FIG. 5E and another signal delay device shown in FIG. 6A-FIG. 6G.

FIG. 8 is a diagram illustrating a comparison between simulation results for an exemplary signal delay device 500 shown in FIG. 5A-FIG. 5E and another signal delay device 600 shown in FIG. 6A-FIG. 6G. In some embodiments, the matching circuit for the signal delay device 500 may be mounted on the PCB (e.g., the surface 602) separately from the signal delay device 500. By contrast, the matching circuits 640-1 and 640-2 for the signal delay device 600 may be integrated with the signal delay device 600 as described above with reference to FIG. 6A-FIG. 6G. As can be seen from FIG. 8, the delay graph 820 for the signal delay device 600 has a better delay performance than that of the delay graph 810 for the signal delay device 500 in terms of its delay ripples. For example, the simulation result of FIG. 8 shows that return loss at input for different matching network may have almost the same matching level across 1.8-2.7 GHz.

Please note that the considerations (a), (b), and (c) may be applied separately or in any combination, and therefore the present disclosure is not limited to the embodiments described above. For example, an embodiment where only the consideration (b) is applied, an embodiment where only the consideration (c) is applied, and/or an embodiment where only the considerations (b) and (c) are applied are also feasible.

The disclosure has been described with reference to embodiments and drawings. It should be understood that various modifications, alternations and additions can be made by those skilled in the art without departing from the spirits and scope of the disclosure. Therefore, the scope of the disclosure is not limited to the above particular embodiments but only defined by the claims as attached and equivalents thereof.

What is claimed is:

1. A device for signal delay, the device comprising:
a frame of insulation material;
multiple signal electrodes provided in the frame, the multiple signal electrodes comprising:
a first signal electrode; and
a second signal electrode electrically connected in series with the first signal electrode;
an input terminal electrically connected to the first signal electrode and configured to receive an input signal; and
an output terminal electrically connected to the second signal electrode and configured to output an output signal that is delayed by the multiple signal electrodes with respect to the input signal, wherein
at least one of the multiple signal electrodes is located at a different height than those of other signal electrodes with respect to a surface on which the device is to be mounted, wherein
the frame has a first hole extending from a first outer surface of the frame to a second outer surface of the frame which is opposed to the first outer surface, thereby forming a first opening in the first outer surface of the frame and a second opening in the second outer surface of the frame,
the frame has a second hole extending from the first outer surface of the frame to the second outer surface of the frame, thereby forming a third opening in the first outer surface of the frame and a fourth opening in the second outer surface of the frame,
the first signal electrode is located in the first hole, and
the second signal electrode is located in the second hole.

2. The device claim 1, wherein
a third signal electrode is located in a third hole extending from the first outer surface of the frame to the second outer surface of the frame, thereby forming a fifth opening in the first outer surface of the frame and a sixth opening in the second outer surface of the frame, and
a fourth signal electrode is located in a fourth hole extending from the first outer surface of the frame to the second outer surface of the frame, thereby forming a seventh opening in the first outer surface of the frame and an eighth opening in the second outer surface of the frame.

3. The device of claim 2, wherein
the first signal electrode is electrically connected to the fourth signal electrode via a first conductive pattern on the second outer surface of the frame,
the fourth signal electrode is electrically connected to the third signal electrode via a second conductive pattern on the first outer surface of the frame, and
the third signal electrode is electrically connected to the second signal electrode via a third conductive pattern on the second outer surface of the frame.

4. The device of claim 3, wherein other outer surfaces of the frame than the first and second outer surfaces have a conductive layer disposed thereon.

5. The device of claim 4, wherein the conductive layer covers the other outer surfaces of the frame completely.

6. The device of claim 4, wherein the first and second outer surfaces have a conductive layer disposed thereon which is insulated from the conductive patterns.

7. The device of claim 1, wherein the first signal electrode comprises a conductive pattern located on the inner surface of the first hole.

8. The device of claim 1, wherein the first signal electrode is electrically connected to the second signal electrode via a conductive pattern on the first outer surface of the frame.

9. The device of claim 1, wherein there are one or more grooves on at least one of the outer surfaces of the frame other than the first and second outer surface, such that each of the grooves reduces the cross-sectional area between adjacent signal electrodes.

10. The device of claim 9, wherein at least one of the grooves has a cross section of a circular segment.

11. The device of claim 10, wherein the at least one of the grooves has a cross section of a semi-circle.

12. The device of claim 1, wherein
the frame has one or more additional holes, and
each of the additional holes has an opening on the first outer surface and another opening on the second outer surface, such that each of the additional holes reduces the cross-sectional area between adjacent signal electrodes.

13. The device of claim 1, further comprising:
an impedance matching circuit located on an outer surface of the device and/or in the device and configured to match the impedance of the device with an impedance of a circuit with which the device is to be electrically coupled.

14. The device of claim 1, wherein the insulation material is ceramic.

15. A power amplifier comprising the device of claim 1.

* * * * *